(12) United States Patent
Nouri

(10) Patent No.: US 6,313,011 B1
(45) Date of Patent: Nov. 6, 2001

(54) METHOD FOR SUPPRESSING NARROW WIDTH EFFECTS IN CMOS TECHNOLOGY

(75) Inventor: Faran Nouri, Los Altos, CA (US)

(73) Assignee: Koninklijke Philips Electronics N.V. (KPENV), Eindhoven (NL)

( * ) Notice: Subject to any disclaimer, the term of this patent is extended or adjusted under 35 U.S.C. 154(b) by 0 days.

(21) Appl. No.: 09/428,733

(22) Filed: Oct. 28, 1999

(51) Int. Cl.[7] ................................................. H01L 21/76
(52) U.S. Cl. ......................... 438/435; 438/424; 438/437
(58) Field of Search ................................ 438/424, 435, 438/437, 427, 430

(56) References Cited

U.S. PATENT DOCUMENTS

| | | |
|---|---|---|
| 5,763,315 | 6/1998 | Benedict et al. . |
| 5,811,347 | 9/1998 | Gardner et al. . |
| 5,882,982 | 3/1999 | Zheng et al. . |
| 5,930,645 | 7/1999 | Lyons et al. . |
| 5,939,765 | 8/1999 | Zheng et al. . |
| 6,001,704 | 12/1999 | Cheng et al. . |
| 6,051,478 | 4/2000 | Ibok . |
| 6,156,620 | * 12/2000 | Puchner et al. ................ 438/400 |

FOREIGN PATENT DOCUMENTS

29905 * 7/1998 (WO) .

OTHER PUBLICATIONS

Nouri, F., Sur, H., Saha, S., Pramanik, D., and Manley, M., An Optimized Shallow Trench Isolation for sub–$0.18\mu m$ ASIC Technologies, pp. 1–11.

Rafferty, C., Vuong, H., Eshraghi, S., Giles, M., Pinto, M., and Hillenius, S., Explanation of Reverse Short Channel Effect by Defect Gradients, pp. 1–4.

Matsuoka, F. et al.; "High–Density Full–CMOS SRAM Cell Technology with a Deep Sub–Micron Spacing Between nMOS and pMOSFET"; IEICE Transactions on Electronics, JP, vol. E77–C, No. 8; pp. 1385–1393; Aug. 1, 1994.

* cited by examiner

Primary Examiner—Trung Dang

(57) ABSTRACT

In an example embodiment, a method for manufacturing a semiconductor device having shallow trench isolation comprises forming a trench region in a substrate having a substantially planar bottom, a first and second sidewall. In the trench region, the method forms a dielectric liner on the bottom and the first and second sidewalls. The dielectric liner is a silicon nitride compound. The dielectric liner minimizes the anomalous increases in threshold voltage with width ($V_t$ versus W) owing to transient enhanced up-diffusion of the channel profile induced by source/drain implant damage. In addition, the anomalous increase in $V_t$ versus W associated with the formation of an interstitial gradient in sub-micron devices is reduced. By using a nitrided liner, $V_t$ roll off due to boron segregation is also minimized.

5 Claims, 1 Drawing Sheet

METHOD FOR SUPPRESSING NARROW WIDTH EFFECTS IN CMOS TECHNOLOGY

FIELD OF INVENTION

The present invention is generally directed to the manufacture of a semiconductor device. In particular, the present invention relates to a process of suppressing narrow width effects by controlling the Transient Enhanced Diffusion (TED) of the source/drain regions as well as boron segregation in a MOS transistor.

BACKGROUND OF INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices has been manufactured having various applications in numerous disciplines. Such silicon-based semiconductor devices often include metal-oxide-semiconductor (MOS) transistors, such as P-channel MOS (PMOS), N-channel MOS (NMOS) and complementary MOS (CMOS) transistors, bipolar transistors, and BiCMOS transistors. Each of these semiconductor devices generally includes a semiconductor substrate on which a number of active devices are formed. The particular structure of a given active device can vary between device types. For example, in a MOS transistor, an active device generally includes a source and drain region and a gate electrode that modulates current between the source and drain regions.

One important step in the manufacturing of such devices is the formation of devices, or portions thereof, using photolithography and etching processes. In photolithography, a wafer substrate is coated with a light-sensitive material called photo-resist. Next, the wafer is exposed to light; the light striking the wafer is passed through a mask plate. This mask plate defines the desired features printed on the substrate. After exposure, the resist-coated wafer substrate is developed. The desired features as defined on the mask are retained on the photoresist-coated substrate while unexposed areas of resist are washed away. The wafer, with the desired defined features, is then etched. Depending upon the production process, the etching may either be a wet etch in which liquid chemicals are used to remove wafer material or a dry etch in which wafer material is subjected to a radio frequency (RF) induced plasma. A challenge in the etching process is maintaining control over the etching of the features, notably in the source/drain electrode regions of the MOS transistor. A further challenge is to control the electrical characteristics of the source/drain region by establishing a suitable doping profile that provides good conductivity within the constraints of design rules which trend further into the sub-micron range.

Doping the source/drain regions of a MOS transistor is typically accomplished through ion implantation. Unmasked areas of the MOS transistor are subjected to a beam of dopant atoms. Ion implantation has a number of advantages, including the ability to precisely control the number of implanted dopant atoms into substrates, for example, within ±3% in a range of about $1\times10^{14}$ to $1\times10^{18}$ atoms/cm$^3$. A significant disadvantage to ion implantation is that it causes damage to the material structure of the target. In the single-crystal substrate of the source/drain region, crystal defects and some amorphous layers are formed. To restore the target material to its pre-implantation condition, thermal processing (e.g., annealing) after implantation must be performed. In some cases, significant implantation damage can not be removed. Damage at the source/drain region can lead to enhanced dopant diffusion or TED (Transient Enhanced Diffusion) of the doping species in the sub-micron realm where shallow source/drain regions are necessary. TED can contribute to the narrow width effect. In addition, the lateral distribution of implanted species (although smaller than lateral diffusion effects) is not zero. This is a limiting factor in fabricating some minimum sized device structures, such as the electrical channel length between source and drain in self-aligned MOS transistors.

In a prior art process, it has been observed that the threshold voltage ($V_t$) increases as the transistor width (W) decreases from 2.0 μm to 0.4 μm. When shallow trench isolation is used, the $V_t$ difference may be greater than 100 mV and is undesirable. This behavior is not expected. This anomalous increase in $V_t$ with the decrease in W is similar to the TED effect described earlier as RSCE. Generally, the $V_t$ of a MOSFET decreases monotonically with decreasing channel length. In some situations, it has been found that $V_t$ initially increased with decreasing channel length (beginning when L~2–3 um), contrary to what is normally expected. The phenomenon observed is the RSCE (Reverse Short Channel Effect), a transient enhanced up-diffusion of the channel profile induced by source/drain implant damage.

The surface recombination of interstitials under the gate gives rise to impurity flux to the surface that raises the threshold voltage. Interstitials are atoms or ions of doping species that occupy spaces between the larger silicon atoms or ions in the crystal lattice. In a prior art process, NMOS devices can be fabricated with two boron channel implants. The first is a shallow boron implant for adjusting the threshold voltage; the second is a deeper implant for suppressing punchthrough.

The effect of the two-boron implant is noted on STI (shallow trench isolation) borders. Interstitials generated during S/D (source/drain) implant recombine at trench sidewalls, giving rise to an interstitial gradient and an impurity flux at the surface. The effect is more pronounced as W gets smaller and the implant damage in the trenches overlap on both sides. Consequently, dopant up-diffusion covers a larger percentage of the width.

In a PMOS transistor, the aforementioned effects do not occur. The P+ implant does not generate as much damage that tends to increase the threshold voltage. In an example process, the N+ implant after the LDD implant is omitted. The LDD implant serves as the source/drain of the transistor. The S/D damage and excess interstitials no longer are there. The $V_t$ versus W for devices without the S/D implant do not show the anomalous increase in $V_t$. The lack of an anomalous increase in the $V_t$ supports the theory that implant damage and the subsequent TED result in the increase in $V_t$ as device width (W) is decreased. Furthermore, it has been observed that boron segregation to the trench sidewalls may lead to subsequent $V_t$ rolloff.

Accordingly, there is a need for a semiconductor device having a trench isolation structure that addresses the TED and boron segregation, is substantially free of defects, and does not add extra manufacturing costs as the process technology is approaching fractional microns in feature sizes.

SUMMARY OF INVENTION

The present invention is exemplified in a number of implementations, one of which is summarized below.

According to one embodiment, a method for manufacturing a semiconductor device having shallow trench isolation comprises forming a trench region in a substrate having a having a depth and cross-section. In the trench region, the method forms a dielectric liner on the trench region.

Forming a dielectric liner according to the present invention, reduces the $V_t$ roll-up and $V_t$ roll-off effects that results in a flatter $V_t$ versus Width curve. Simulations have shown the effects are not only due to geometric STI corner effect and the resultant enhanced field but also to boron segregation to the trench sidewalls. A dielectric liner may consist of a nitrided oxide or silicon nitride that inhibits the boron segregation to the trench sidewalls.

In another embodiment, a method for manufacturing a semiconductor device having trench isolation comprises forming a trench region in a semiconductor substrate until a trench having a depth and cross-section is formed. A mask layer disposed above the semiconductor substrate defines the trench. Etching forms the trench region. The cross-section of the trench comprises etching a substantially planar bottom surface. Next, a first and second sidewall in the trench, which slopes inwardly toward the center of the bottom surface of the trench, is etched. At the interfaces of the first and second sidewalls and the bottom surface of the trench, rounded bottom trench corners are formed. At the interface of the first and second sidewall and the top surface of the semiconductor substrate, rounded upper trench corners are formed. Having formed the trench, a dielectric liner is formed thereon.

The above summary of the present invention is not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which.

Figure 1A:
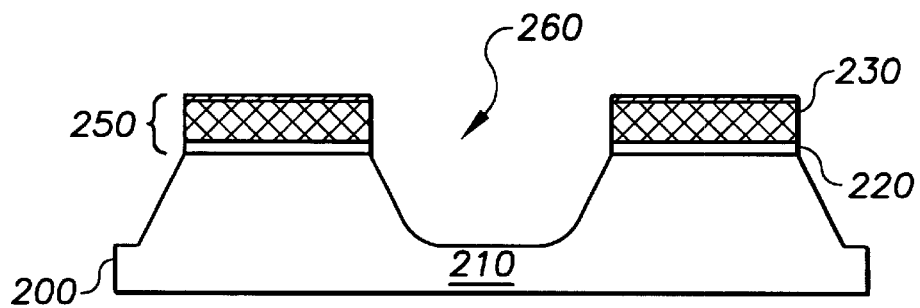
FIG. 1A depicts a device in an example STI process in which a trench is defined.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The present invention has been found useful and advantageous in connection with processes used to manufacture MOS-type transistors. In a particular application, the present invention has been found useful in suppressing anomalous increases in $V_t$ with W by depositing a liner dielectric of nitride or nitrided oxide in silicon trenches as part of a trench isolation process. Typically, the trench isolation process involves forming shallow trenches in the silicon, and filling in the trenches with oxide or other suitable dielectric material. In the discussion that follows, a MOS structure is used to describe an example implementation of the invention. However, the invention is not necessarily limited to MOS. It may be applied to alternate technologies such as bipolar, silicon on substrate, gallium arsenide, and combinations thereof.

The invention reduces the $V_t$ roll-up and $V_t$ toll-off effects that results in a flatter $V_t$ versus Width curve. Simulations have shown the effects are not only due to geometric STI corner effect and the resultant enhanced field but also to boron segregation to the trench sidewalls. A dielectric liner of a nitrided oxide or silicon nitride inhibits the boron segregation to the trench sidewalls.

Figure 1B:
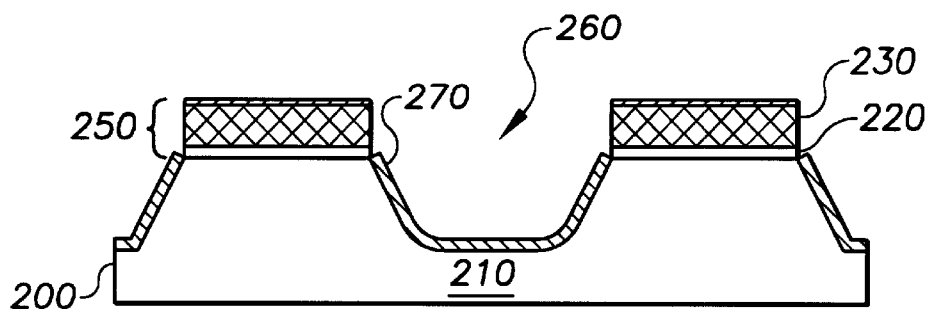
FIG. 1B shows the dielectric liner applied to the walls of the trench of FIG. 1A according to an embodiment of the present invention.

A semiconductor device having shallow trench isolation that exhibits the improved $V_t$ versus Width characteristics first has a trench region formed in the substrate. A desirable trench region usually has a substantially planar bottom, a first sidewall and a second sidewall. Next, the dielectric liner is formed on the bottom and on the sidewalls of the trench region. FIG. 1B depicts an example structure. For further information regarding methods for forming trench isolation generally and one particular method useful in connection with the above embodiment, reference may be made to U.S. Pat. No. 5,882,982 entitled "Trench Isolation Method" assigned to the instant assignee and herein incorporated by reference in its entirety. Such a profile does not have sharp corners or other discontinuities. In a semiconductor substrate, the process first involves etching a substantially planar bottom surface in the trench. Next, a first sidewall and a second sidewall sloping inwardly toward the center of the substantially planar bottom surface are etched. Where the first and second sidewalls meet the bottom surface, rounded bottom corners (as shown in FIG. 1A) are etched. First and second rounded upper trench corners are etched where the first and second sidewalls meet the top surface of the semiconductor substrate.

A specific example STI (shallow trench isolation) process begins with a silicon substrate. A thin layer of silicon dioxide is formed upon the silicon substrate. In an example process, about 100 Å of $SiO_2$ is deposited on the silicon substrate. Following the oxide deposition, a substantially thicker layer of silicon nitride is deposited upon the thin oxide layer. For example, the process can include a deposit of about 1800 Å of silicon nitride. The photoresist mask is then stripped. Using SiN as a mask, the process includes etching shallow silicon trenches. Some or all of the SiN is removed depending upon its thickness and the etch selectivity.

Having formed the trench, a liner dielectric is grown therein. In an example embodiment according to the present invention, the liner dielectric replaces the liner oxide of the prior art process. The liner dielectric is a nitrided oxide such as silicon oxynitride. In another example embodiment, the liner dielectric may be silicon nitride. The thickness of the liner dielectric may range from about 100 Å to 300 Å.

The formed trenches receive a fill deposition of a dielectric. In an example process, oxide is deposited at a thickness of between about 6000 Å to 9000 Å to fill trenches having depths that range from about 2500 Å to 3500 Å. A planarization process removes excess oxide. The remaining silicon nitride is used as an etch stop. In a modern sub-micron process, chemical-mechanical polishing (CMP) planarizes the features.

Referring to FIG. 1A, in a device 200 an example STI process has defined a trench 260 in a substrate 210. A mask layer 250 defines the trench 260. The mask layer is made of a thin oxide layer 220 covered by a substantially thicker nitride layer 230.

As depicted in FIG. 1B, having defined the trench isolation regions which includes trench 260, a liner dielectric 270 is applied to the walls of trench 260. The liner dielectric 270 may be a nitrided oxide such as silicon oxynitride or may be silicon nitride. In one example process, the liner dielectric 270 is applied through chemical vapor deposition (CVD). The liner dielectric 270 may also be thermally grown on the walls of the trench 260 by placing the substrate 200 in a reaction furnace.

Figure 1C:
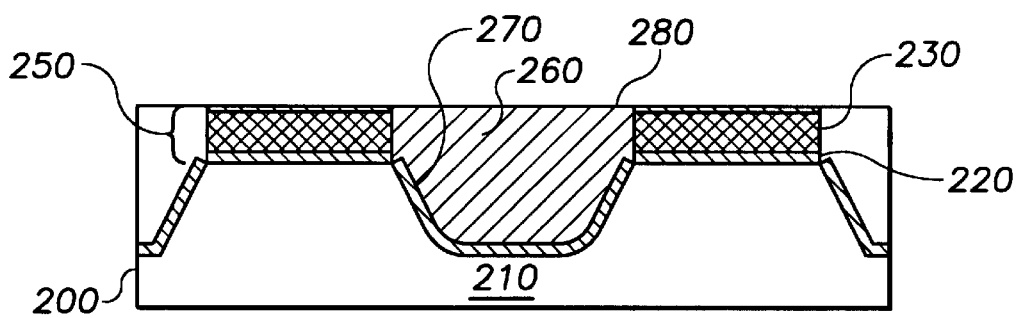
FIG. 1C depicts the structure of FIG. 1B after deposition of a fill oxide in the trench.

Referring to FIG. 1C, the example process deposits a fill oxide 280 in the trenches after applying the liner dielectric 270. In one example process, a high-density plasma (HDP) oxide 280 is deposited at a thickness of about 7300 Å. The HDP oxide 280 is planarized with a CMP process that uses the silicon nitride layer 230 as an etch stop. Having smoothed out the topography, the substrate undergoes subsequent processing to build the transistors.

The transistors that make up integrated circuits built on the silicon substrate have STI regions electrically isolating the transistors from one another. Owing to the application of a nitrided dielectric into the STI trenches, the transistors are less likely to be degraded from STI corner effect, TED, and boron segregation than transistors without a nitrided dielectric in the STI. The protected transistors exhibit a flatter $V_t$ versus Width characteristic. Consequently, the performance and reliability of the integrated circuits are improved.

While the present invention has been described with reference to several particular example embodiments, those skilled in the art will recognize that many changes may be made thereto without departing from the spirit and scope of the present invention, which is set forth in the following claims.

What is claimed:

1. A shallow trench isolation method for forming a semiconductor device isolating structure on a semiconductor substrate comprising:

masking a semiconductor substrate with a mask layer to define the location of a trench;

etching the semiconductor substrate in the location of the trench to form a trench, having a depth and a cross-section in the semiconductor substrate, the trench being defined by the mask layer disposed above the semiconductor substrate and the etching forming the trench region, with the cross-section comprising:

etching a substantially planar bottom surface in the trench;

etching a first and a second sidewall in the trench sloping inwardly towards the center of said substantially planar bottom surface;

etching a first and a second rounded bottom trench corner in the trench at an interface of the first sidewall and the substantially planar bottom surface; and etching a first and a second rounded upper trench corner in the trench at the interface of the first and the second sidewall respectively and a top surface of the semiconductor substrate; and depositing a dielectric liner on the first and second sidewalls and bottom surface of the trench.

2. The method of claim 1 further comprising;

depositing a dielectric material on the semiconductor substrate filling the trench; and planarizing the dielectric material such that it is substantially flush with the mask layer.

3. The method of claim 2 wherein the masking layer comprises:

forming a dielectric stack on the semiconductor substrate comprising a layer of silicon dioxide and a layer of silicon nitride;

masking the dielectric stack with a photo resist, exposing the photo resist to light;

etching a trench pattern by etching unmasked areas of the dielectric stack until the semiconductor substrate is exposed; and removing the photo resist.

4. The method of claim 3 wherein the dielectric stack is further comprised of a layer of silicon oxynitride on the silicon nitride.

5. The method of claim 3 wherein the dielectric material is silicon dioxide.

* * * * *